United States Patent
Hirose

(10) Patent No.: US 12,315,719 B2
(45) Date of Patent: May 27, 2025

(54) SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventor: Yoshiro Hirose, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 473 days.

(21) Appl. No.: 17/679,808

(22) Filed: Feb. 24, 2022

(65) Prior Publication Data
US 2022/0310383 A1 Sep. 29, 2022

(30) Foreign Application Priority Data
Mar. 24, 2021 (JP) .................................. 2021-049869

(51) Int. Cl.
*H01L 21/00* (2006.01)
*C23C 16/40* (2006.01)
(Continued)

(52) U.S. Cl.
CPC ........ *H01L 21/0228* (2013.01); *C23C 16/401* (2013.01); *C23C 16/45565* (2013.01); *H01L 21/02178* (2013.01)

(58) Field of Classification Search
CPC ........... H01L 21/0228; H01L 21/02178; C23C 16/401; C23C 16/45565
See application file for complete search history.

(56) References Cited

U.S. PATENT DOCUMENTS

2008/0124484 A1   5/2008   Shinriki et al.
2009/0035947 A1*  2/2009   Horii .................... H01L 28/65
                                                    118/704

(Continued)

FOREIGN PATENT DOCUMENTS

CN       105390378 A    3/2016
JP       2008-124464 A  5/2008
(Continued)

OTHER PUBLICATIONS

Chinese Office Action issued on Jan. 11, 2024 for Chinese Patent Application No. 202210113682.1.

*Primary Examiner* — Richard A Booth
(74) *Attorney, Agent, or Firm* — Volpe Koenig

(57) ABSTRACT

There is provided a technique capable of improve the uniformity of the film formed on the substrate. According to one aspect of the technique, there is provided a substrate processing method includes: (a) setting a substrate at a first position such that a distance between the first position and a gas supply port of a film-forming auxiliary gas supplier is a first distance, and causing a film-forming auxiliary gas to be adsorbed onto the substrate by supplying the film-forming auxiliary gas to the substrate; and (b) moving the substrate to a second position such that a distance between the second position and a gas supply port of a source gas supplier is a second distance different from the first distance, and forming a film of a predetermined thickness on the substrate by supplying a source gas.

14 Claims, 7 Drawing Sheets

(51) Int. Cl.
    *C23C 16/455*     (2006.01)
    *H01L 21/02*     (2006.01)

(56) References Cited

U.S. PATENT DOCUMENTS

| | | |
|---|---|---|
| 2015/0371875 A1 | 12/2015 | Sasaki et al. |
| 2016/0064219 A1* | 3/2016 | Yamamoto ........ H01J 37/32449<br>118/725 |
| 2017/0335453 A1 | 11/2017 | Miura |

FOREIGN PATENT DOCUMENTS

| | | |
|---|---|---|
| JP | 5384291 B | 10/2013 |
| JP | 2016-9742 A | 1/2016 |
| JP | 2017-212246 A | 11/2017 |

\* cited by examiner

SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2021-049869, filed on Mar. 24, 2021, in the Japanese Patent Office, the entire contents of which are hereby incorporated by reference.

BACKGROUND

1. Field

The present disclosure relates to a substrate processing method, a method of manufacturing a semiconductor device, a non-transitory computer-readable recording medium and a substrate processing apparatus.

2. Related Art

In a method of manufacturing a semiconductor device, a substrate processing apparatus configured to perform a predetermined substrate processing on a substrate may be used. As the substrate processing, for example, a film-forming process in which a plurality of kinds of gases are sequentially supplied may be performed.

When performing the predetermined substrate processing on the substrate, optimum process conditions such as a process pressure and a supply amount may vary depending on a type of a film formed on the substrate and a type of a gas to be supplied. Therefore, when the substrate processing apparatus described above is used, a uniformity of the film formed on the substrate may deteriorate because a distance between a gas supply port through which the gas is supplied and the substrate is constant.

SUMMARY

According to the present disclosure, there is provided a technique capable of improving a uniformity of a film formed on a substrate.

According to one or more embodiments of the present disclosure, there is provided a technique related to a substrate processing method including: a substrate processing method by using a substrate processing apparatus comprising: a process chamber in which a substrate is processed; a substrate support provided in the process chamber; a film-forming auxiliary gas supplier through which a film-forming auxiliary gas is supplied into the process chamber while the substrate being supported on the substrate support; and a source gas supplier through which a source gas is supplied into the process chamber while the substrate being supported on the substrate support, the substrate processing method comprising: (a) setting the substrate at a first position such that a distance between the first position and a gas supply port of the film-forming auxiliary gas supplier is a first distance, and causing the film-forming auxiliary gas to be adsorbed onto the substrate by supplying the film-forming auxiliary gas to the substrate; and (b) moving the substrate to a second position such that a distance between the second position and a gas supply port of the source gas supplier is a second distance different from the first distance, and forming a film of a predetermined thickness on the substrate by supplying the source gas.

DETAILED DESCRIPTION

Embodiments

Figure 1:
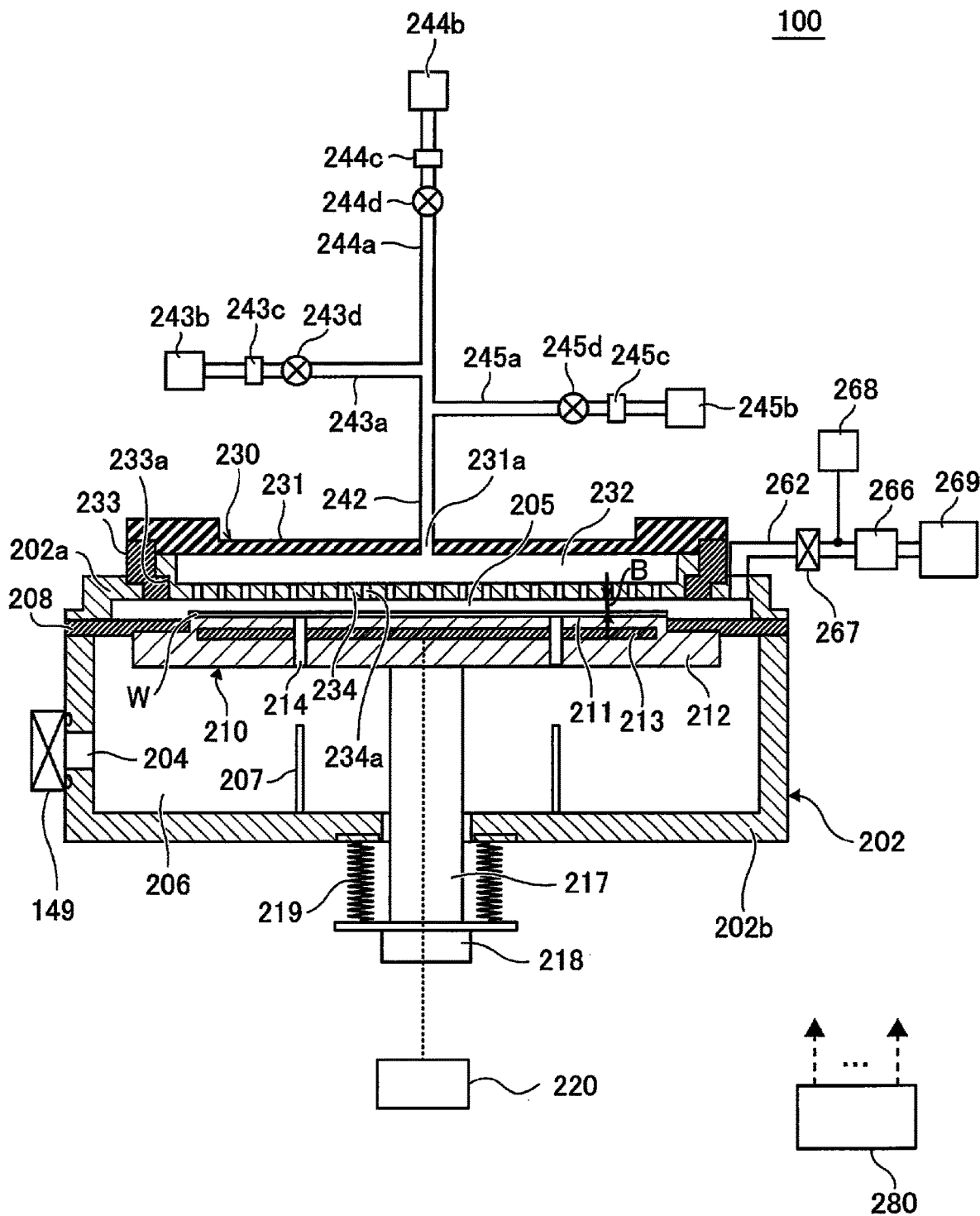
FIG. 1 is a diagram schematically illustrating a vertical cross-section of a process furnace of a substrate processing apparatus preferably used in a first embodiment of the present disclosure.

Hereinafter, one or more embodiments (also simply referred to as "embodiments") according to the technique of the present disclosure will be described with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

First Embodiment

Hereinafter, a first embodiment according to the technique of the present disclosure will be described.

(1) Configuration of Substrate Processing Apparatus

As shown in FIG. 1, a substrate processing apparatus 100 includes a process vessel 202. For example, the process vessel 202 includes a flat and sealed vessel whose horizontal cross-section is circular. For example, the process vessel 202 is made of a metal material such as aluminum (Al) and stainless steel (SUS). A process space 205 in which a wafer W serving as a substrate is processed and a transfer space 206 through which the wafer W passes when the wafer W is transferred into or out of the process space 205 are provided in the process vessel 202. A process chamber is constituted by an inner space of the process vessel 202. The process vessel 202 is constituted by an upper vessel 202a and a lower vessel 202b. A partition plate 208 is provided between the upper vessel 202a and the lower vessel 202b.

A substrate loading/unloading port 204 is provided adjacent to a gate valve 149 at a side surface of the lower vessel 202b. The wafer W is transferred between the transfer space 206 and a transfer chamber (not shown) through the substrate loading/unloading port 204. A plurality of lift pins 207 are provided at a bottom of the lower vessel 202b.

A substrate support 210 configured to support the wafer W is provided in the process space 205. The substrate support 210 mainly includes: a substrate mounting table 212 provided with a substrate placing surface 211 on which the wafer W is placed; and a heater 213 serving as a heating source provided in the substrate mounting table 212. A plurality of through-holes 214 through which the lift pins 207 penetrate are provided at positions of the substrate mounting table 212 in a manner corresponding to the lift pins 207. A heater controller 220 is connected to the heater 213, and the heater 213 is heated to a desired temperature according to an instruction from a controller 280 described later.

A shower head 230 serving as a gas dispersion structure is provided in an upper portion (upstream side) of the process space 205. A lid 231 of the shower head 230 is provided with a gas introduction hole 231a. The gas introduction hole 231a is configured to communicate with a gas supply pipe 242 described later.

The shower head 230 is provided with a dispersion plate 234 serving as a dispersion structure configured to disperse a gas such as a first source gas and a second source gas. An upstream side of the dispersion plate 234 is referred to as a buffer space 232, and a downstream side of the dispersion plate 234 is referred to as the process space 205. The dispersion plate 234 is provided with a plurality of through-holes 234a serving as a gas supply port. The dispersion plate 234 is arranged so as to face the substrate placing surface 211. For example, the dispersion plate 234 is of a disk shape. The through-holes 234a are provided over an entire surface of the dispersion plate 234.

The upper vessel 202a includes a flange (not shown). A support block 233 is placed on and fixed to the flange. The support block 233 includes a flange 233a. The dispersion plate 234 is placed on and fixed to the flange 233a. In addition, the lid 231 is fixed to an upper surface of the support block 233.

<Gas Supplier>

The gas supply pipe 242 is connected to the lid 231 of the shower head 230 so as to communicate with the gas introduction hole 231a provided at the lid 231. A first gas supply pipe 243a, a second gas supply pipe 244a and a third gas supply pipe 245a are connected to the gas supply pipe 242.

<First Gas Supplier>

A first gas supply source 243b, a mass flow controller (also simply referred to as an "MFC") 243c serving as a flow rate controller (flow rate control structure) and a valve 243d serving as an opening/closing valve are sequentially provided in this order at the first gas supply pipe 243a from an upstream side toward a downstream side of the first gas supply pipe 243a in a gas flow direction.

An adsorption assist gas serving as a process gas is supplied into the process space 205 through the first gas supply pipe 243a provided with the MFC 243c and the valve 243d, the gas supply pipe 242, the gas introduction hole 231a, the buffer space 232 and the through-holes 234a. The adsorption assist gas assists an adsorption of the first source gas described later onto a surface of the wafer W. For example, water vapor ($H_2O$) may be used as the adsorption assist gas. Since the adsorption assist gas assists a film-forming reaction involving the first source gas and the second source gas supplied in a film-forming step described later, the adsorption assist gas may also be referred to as a "film-forming auxiliary gas".

A first gas supplier (which is a first gas supply structure or a first gas supply system) is constituted mainly by the first gas supply pipe 243a, the MFC 243c and the valve 243d. The first gas supplier may also be referred to as a "film-forming auxiliary gas supplier" (which is a film-forming auxiliary gas supply structure or a film-forming auxiliary gas supply system) or an "adsorption assist gas supplier" (which is an adsorption assist gas supply structure or an adsorption assist gas supply system). The first gas supplier may further include the first gas supply source 243b.

<Second Gas Supplier>

A second gas supply source 244b, an MFC 244c and a valve 244d are sequentially provided in this order at the second gas supply pipe 244a from an upstream side toward a downstream side of the second gas supply pipe 244a in the gas flow direction.

The first source gas is supplied into the process space 205 through the second gas supply pipe 244a provided with the MFC 244c and the valve 244d, the gas supply pipe 242, the gas introduction hole 231a, the buffer space 232 and the through-holes 234a.

A second gas supplier (which is a second gas supply structure or a second gas supply system) is constituted mainly by the second gas supply pipe 244a, the MFC 244c and the valve 244d. The second gas supplier may also be referred to as a "first source gas supplier" (which is a first source gas supply structure or a first source gas supply system) or a "source gas supplier" (which is a source gas supply structure or a source gas supply system). The second gas supplier may further include the second gas supply source 244b.

For example, a silicon-containing gas may be used as the first source gas. As the silicon-containing gas, for example, dichlorosilane ($SiH_2Cl_2$, also referred to as "DCS") gas or hexachlorodisilane ($Si_2Cl_6$, also referred to as "HCDS") gas is used as the silicon-containing gas.

<Third Gas Supplier>

A third gas supply source 245b, an MFC 245c and a valve 245d are sequentially provided in this order at the third gas supply pipe 245a from an upstream side toward a downstream side of the third gas supply pipe 245a in the gas flow direction.

The second source gas is supplied into the process space 205 through the third gas supply pipe 245a provided with the MFC 245c and the valve 245d, the gas supply pipe 242, the gas introduction hole 231a, the buffer space 232 and the through-holes 234a.

A third gas supplier (which is a third gas supply structure or a third gas supply system) is constituted mainly by the third gas supply pipe 245a, the MFC 245c and the valve 245d. The third gas supplier may also be referred to as a "second source gas supplier" (which is a second source gas supply structure or a second source gas supply system) or a "reactive gas supplier" (which is a reactive gas supply structure or a reactive gas supply system). The third gas supplier may further include the third gas supply source 245b.

For example, a gas containing one of oxygen (O), nitrogen (N) and carbon (C) and reacting with the first source gas may be used as the second source gas. The present embodiment will be described in detail by way of an example in which an oxygen-containing gas is used as the second source gas. Specifically, ozone (O3) gas is used as the oxygen-containing gas. The first source gas and the second source gas react with each other to form a silicon oxide film (also simply referred to as an "SiO film") on the wafer W.

In addition, an inert gas supplier (which is an inert gas supply structure or an inert gas supply system: not shown) through which an inert gas such as nitrogen ($N_2$) gas is supplied is connected to the gas supply pipe 242. The inert gas serves as a purge gas for purging a gas remaining in the process vessel 202 or the shower head 230 in a substrate processing described later.

That is, the shower head 230 functions as the film-forming auxiliary gas supplier (adsorption assist gas supplier) when the adsorption assist gas serving as the process gas is supplied into the process vessel 202. Further, the shower head 230 functions as the first source gas supplier or the second source gas supplier when the first source gas or the second source gas is supplied into the process vessel 202. Further, the shower head 230 functions as the inert gas supplier when the inert gas is supplied into the process vessel 202.

The substrate mounting table 212 is supported by a shaft 217. The shaft 217 penetrates a bottom of the process vessel 202, and is connected to an elevator 218 at an outside of the process vessel 202.

The elevator 218 is constituted mainly by: a support shaft (not shown) configured to support the shaft 217; and an actuator (not shown) configured to elevate/lower or rotate the support shaft. For example, the actuator may include: an elevating structure (not shown) such as a motor configured to elevate and lower the support shaft; and a rotator (not shown) such as a gear configured to rotate the support shaft.

The wafer W placed on the substrate placing surface 211 of the substrate mounting table 212 may be elevated or lowered by operating the elevator 218 by elevating or lowering the shaft 217 and the substrate mounting table 212. In addition, a bellows 219 covers a periphery of a lower end of the shaft 217 to maintain the process space 205 airtight.

Figure 2:
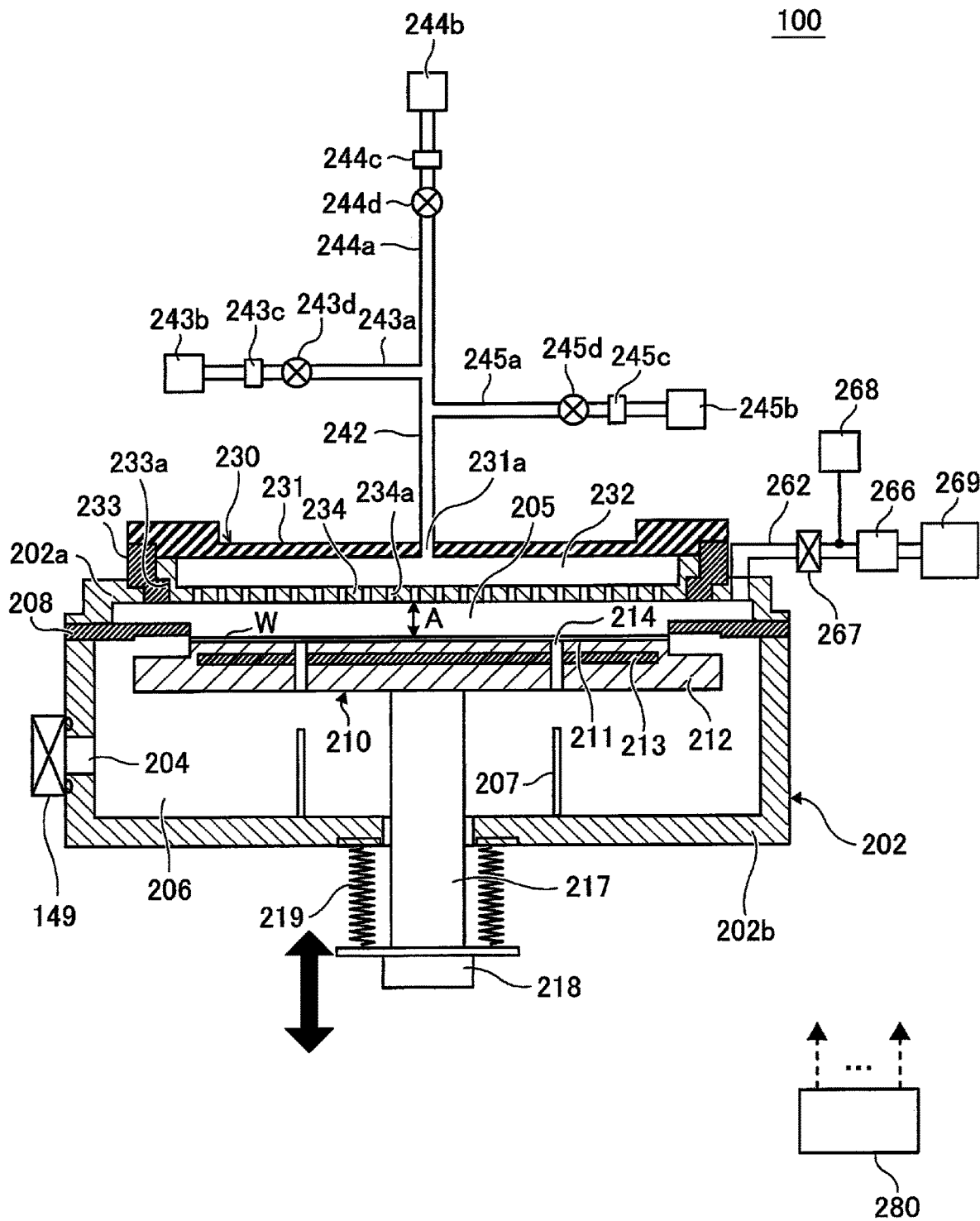
FIG. 2 is a diagram schematically illustrating a vertical cross-section of the process furnace of the substrate processing apparatus preferably used in the first embodiment of the present disclosure when a substrate is located at a first position.

When the wafer W is transferred, the substrate mounting table 212 is lowered until the substrate placing surface 211 faces the substrate loading/unloading port 204, that is, until a transfer position of the wafer W is reached. When the wafer W is processed in an adsorption assist processing step described later, the substrate mounting table 212 is elevated until the wafer W reaches a first position below the process space 205 as shown in FIG. 2. When the wafer W is processed in a film-forming step described later, the substrate mounting table 212 is elevated until the wafer W reaches a second position (which is a processing position) in the process space 205 as shown in FIG. 1. According to the present embodiment, as shown in FIG. 2, the first position refers to a position at which a distance between the surface of the wafer W and the through-holes 234a of the shower head 230 facing the surface of the wafer W is a first distance "A" shown in FIG. 2. Further, as shown in FIG. 1, the second position refers to a position at which the distance between the surface of the wafer W and the through-holes 234a of the shower head 230 facing the surface of the wafer W is a second distance "B" shown in FIG. 1 different from the first distance A. In addition, the second position is a position different from the first position in a vertical direction, and, for example, the second distance B is set to be shorter than the first distance A.

Specifically, the first distance A and the second distance B are distances from a front end (tip) of the through-holes 234a to the surface of the wafer W. However, in the present embodiment, for convenience of explanation, each of the first distance A and the second distance B is described as a distance from the through-holes 234a to the surface of the wafer W.

In addition, for example, the front end of the through-holes 234a may refer to a front end of a structure constituting the through-holes 234a with reference to a direction facing the wafer W. For example, a lower end of the dispersion plate 234 may be referred to as the front end of the through-holes 234a.

<Exhauster>

Hereinafter, an exhauster (which is an exhaust structure) through which an inner atmosphere of the process vessel 202 is exhausted will be described. An exhaust pipe 262 is connected to the process vessel 202 so as to communicate with the process space 205. The exhaust pipe 262 is provided at a side surface of the process space 205. An APC (Automatic Pressure Controller) 266 is provided at the exhaust pipe 262. The APC 266 serves as a pressure controller capable of controlling an inner pressure of the process space 205 to a predetermined pressure. The APC 266 includes a valve body (not shown) whose opening degree can be adjusted. The APC 266 is configured to adjust a conductance of the exhaust pipe 262 in accordance with an instruction from the controller 280. A valve 267 is provided at the exhaust pipe 262 on an upstream side of the APC 266. A pressure monitor 268 configured to measure a pressure of the exhaust pipe 262 is provided at the exhaust pipe 262 on a downstream side of the valve 267.

The pressure monitor 268 monitors the pressure of the exhaust pipe 262. Since the exhaust pipe 262 and the process space 205 communicate with each other, the inner pressure of the process space 205 is indirectly monitored. The pressure monitor 268 is electrically connected to the controller 280, and is configured to transmit detected pressure data to the controller 280.

The exhaust pipe 262, the pressure monitor 268, the valve 267 and the APC 266 may be collectively referred to as the exhauster (which is the exhaust structure). In addition, as shown in FIG. 1, a vacuum pump 269 is provided at the exhaust pipe 262. The vacuum pump 269 is configured to exhaust the inner atmosphere of the process space 205 through the exhaust pipe 262.

<Controller>

The substrate processing apparatus 100 includes the controller 280 configured to control operations of components constituting the substrate processing apparatus 100.

Figure 3:
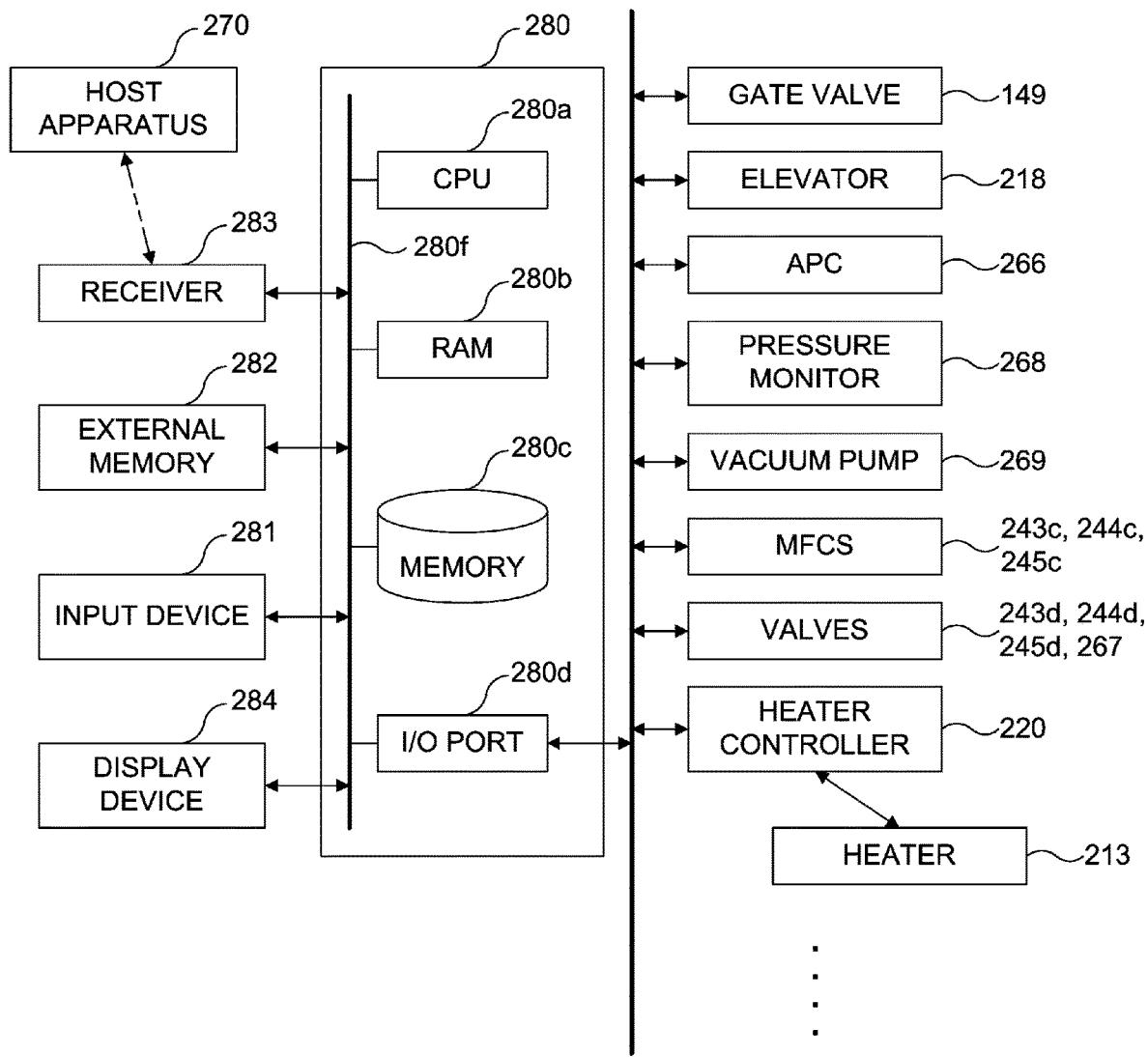
FIG. 3 is a block diagram schematically illustrating a configuration of a controller and related components of the substrate processing apparatus preferably used in the first embodiment of the present disclosure.

FIG. 3 is a diagram schematically illustrating a configuration of the controller 280. The controller 280 serving as a control apparatus (control structure) may be embodied by a computer including a CPU (Central Processing Unit) 280a, a RAM (Random Access Memory) 280b, a memory 280c serving as a storage and an I/O port (input/output port) 280d. The RAM 280b, the memory 280c and the I/O port 280d may exchange data with the CPU 280a via an internal bus 280f.

For example, an input device 281 such as a keyboard and an external memory 282 are connected to the controller 280. In addition, a receiver 283 connected to a host apparatus 270 via a network is provided.

A display device 284 is configured to display information such as data detected by the pressure monitor 268. While the present embodiment will be described by way of an example in which the input device 281 and the display device 284 are provided separately. However, the present embodiment is not limited thereto. For example, when the input device 281 is constituted by a touch panel serving as a display screen, the input device 281 and the display device 284 may be integrally provided as a single body.

The memory 280c is configured by a component such as a flash memory and a hard disk drive (HDD). For example, a process recipe containing information on sequences and conditions of the substrate processing described later, a recipe program serving as a control program configured to control the operation of the substrate processing apparatus 100 to perform the substrate processing, and a table described later may be readably stored in the memory 280c. The process recipe is obtained by combining steps of the substrate processing described later such that the controller 280 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to both of the process recipe and the control program. The RAM 280b functions as a memory area (work area) where a program or data read by the CPU 280a is temporarily stored.

The I/O port 280d is electrically connected to the components of the substrate processing apparatus 100 described above such as the gate valve 149, the elevator 218, the APC 266, the pressure monitor 268, the vacuum pump 269, the MFCs 243c, 244c and 245c, the valves 243d, 244d, 245d and 267 and the heater controller 220.

The CPU 280a is configured to read and execute the control program from the memory 280c and read the process recipe from the memory 280c in accordance with an instruction such as an operation command inputted from the input device 281. The CPU 280a is configured to be capable of controlling various operations in accordance with the contents of the process recipe such as an opening and closing operation of the gate valve 149, an elevating and lowering operation of the elevator 218, a pressure detecting operation of the pressure monitor 268, an ON/OFF control operation of the vacuum pump 269, a flow rate adjusting operation of each of the MFCs 243c, 244c and 245c, an opening and closing operation of each of the valves 243d, 244d, 245d, 267 and the APC 266 and a temperature adjusting operation of the heater 213 by the heater controller 220.

The controller 280 according to the present embodiment may be embodied by installing the above-described program stored in the external memory 282 into a computer. For example, the external memory 282 may include a magnetic disk such as a hard disk, an optical disk such as a DVD, a magneto-optical disk such as an MO and a semiconductor memory such as a USB memory.

A method of providing the program to the computer is not limited to the external memory 282. For example, the program may be directly provided to the computer by a communication means such as the Internet and a dedicated line instead of the external memory 282. In addition, the memory 280c or the external memory 282 may be embodied by a non-transitory computer readable recording medium. Hereafter, the memory 280c and the external memory 282 are collectively or individually referred to as a "recording medium". In the present specification, the term "recording medium" may refer to the memory 280c alone, may refer to the external memory 282 alone, and may refer to both of the memory 280c and the external memory 282.

(2) Substrate Processing

Hereinafter, as a part of a manufacturing process of a semiconductor device, an example of the substrate processing of forming a film on the wafer W will be described. The substrate processing of forming the film is performed using the substrate processing apparatus 100 described above. In the following description, the operations of the components constituting the substrate processing apparatus 100 are controlled by the controller 280.

Hereinafter, the substrate processing according to the present embodiment will be described in detail with reference to FIG. 4.

The substrate processing according to the present embodiment may include:

(a) setting the wafer W at the first position such that the distance between the first position and the through-holes 234a of the shower head 230 is the first distance "A", and causing the adsorption assist gas to be adsorbed onto the wafer W by supplying the adsorption assist gas to the wafer W; and (b) moving the wafer W to the second position such that the distance between the second position and the through-holes 234a of the shower head 230 is the second distance "B" different from the first distance "A", and forming the film of a desired thickness on the wafer W by supplying the source gas.

Further, a cycle is performed at least once in (b), the cycle including: (b-1) causing a first source contained in the first source gas to be adsorbed onto the wafer W by supplying the first source gas to the wafer W; and (b-2) causing the first source adsorbed on the wafer W to react with a second source contained in the second source gas by supplying the second source gas to the wafer W.

Further, in the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer or a film formed on a wafer". That is, the term "wafer" may collectively refer to "a wafer and a predetermined layer (or layers) or a film (or films) formed on a surface of the wafer". In addition, in the present specification, the term "a surface of a wafer" may refer to "a surface (exposed surface) of a wafer itself" or may refer to "a surface of a predetermined layer or a film formed on a wafer, i.e., a top surface (uppermost surface) of the wafer as a stacked structure".

Thus, in the present specification, "supplying a predetermined gas to a wafer" may refer to "supplying a predetermined gas directly to a surface (exposed surface) of a wafer itself" or may refer to "supplying a predetermined gas to a layer or a film formed on a wafer, i.e., a top surface of the wafer as a stacked structure"). In addition, in the present specification, "forming a predetermined layer (or a film) on a wafer" may refer to "forming a predetermined layer (or a film) directly on a surface (exposed surface) of a wafer itself" or may refer to "forming a predetermined layer (or a film) on a surface of a predetermined layer or a film formed on a wafer, i.e., a top surface (uppermost surface) of the wafer as a stacked structure".

In the present specification, the terms "substrate" and "wafer" may be used as substantially the same meaning. That is, the term "wafer" may be substituted by "substrate" and vice versa.

<Substrate Loading and Placing Step S10>

In the substrate processing apparatus 100, the substrate mounting table 212 is lowered to the transfer position of the wafer W such that the lift pins 207 penetrate through the through-holes 214 of the substrate mounting table 212. As a result, the lift pins 207 protrude from the surface of the substrate mounting table 212 by a predetermined height.

Subsequently, the gate valve 149 is opened, and the wafer W (the wafer to be processed) is transferred (loaded) into the process chamber using a wafer transfer device (not shown). Then, the wafer W is placed onto the lift pins 207. As a result, the wafer W is supported on the lift pins 207 protruding from the surface of the substrate mounting table 212 in a horizontal orientation.

After the wafer W is loaded into the process vessel 202, the wafer transfer device is retracted to the outside of the process vessel 202, and the gate valve 149 is closed to seal (close) the inside of the process vessel 202 hermetically. Thereafter, by elevating the substrate mounting table 212, the wafer W is placed on the substrate placing surface 211 of the substrate mounting table 212.

When the wafer W is loaded into the process vessel 202 serving as the process chamber in which the wafer W is processed, it is preferable that the $N_2$ gas serving as the inert gas is supplied into the process vessel 202 by the inert gas supplier while exhausting the process vessel 202 by the exhauster described above. That is, it is preferable that the inert gas is supplied into the process vessel 202 by at least opening a valve of the inert gas supplier while exhausting the process vessel 202 with the vacuum pump 269 in operation and the APC 266 opened. Thereby, it is possible to prevent (or suppress) particles from entering the process vessel 202 and from adhering onto the wafer W. In addition, the vacuum pump 269 may continuously exhaust the process vessel 202 from the substrate loading and placing step S10 until at least a substrate unloading step S18 described later is completed.

When the wafer W is placed on the substrate mounting table 212, the electric power is supplied to the heater 213 embedded in the substrate mounting table 212 such that a temperature (surface temperature) of the wafer W is adjusted to a predetermined temperature. For example, a temperature of the heater 213 is adjusted by controlling a state of electric conduction to the heater 213 based on temperature information detected by a temperature sensor (not shown).

<Adsorption Assist Processing Step>

Then, the adsorption assist processing step is performed by performing an adsorption assist gas supply step S11 and a residual gas removing step S12 described below.

<Adsorption Assist Gas Supply Step S11>

Subsequently, by elevating the substrate mounting table 212, the wafer W is moved to the first position at which the distance from the through-holes 234a is the first distance A as shown in FIG. 2.

Then, the valve 243d of the first gas supply pipe 243a is opened to supply the adsorption assist gas into the first gas supply pipe 243a. A flow rate of the adsorption assist gas supplied into the first gas supply pipe 243a is adjusted by the MFC 243c. The adsorption assist gas whose flow rate is adjusted is then supplied into the process space 205 through the gas supply pipe 242, the gas introduction hole 231a, the buffer space 232 and the through-holes 234a, and is exhausted through the exhaust pipe 262.

When the adsorption assist gas is supplied, simultaneously, the $N_2$ gas serving as the inert gas may be supplied through the gas supply pipe 242. The $N_2$ gas whose flow rate is adjusted is then supplied into the process space 205 through the gas supply pipe 242, the gas introduction hole 231a, the buffer space 232 and the through-holes 234a, and is exhausted through the exhaust pipe 262.

In the adsorption assist gas supply step S11, the adsorption assist gas is supplied into the process space 205 with the wafer W supported by the substrate mounting table 212. By supplying the adsorption assist gas to the wafer W, the adsorption assist gas is adsorbed onto the surface of the wafer W to form a dangling bond (which is constituted by a component of the adsorption assist gas). In the present embodiment, by the wafer W physically adsorbing the component of the adsorption assist gas (for example, an oxygen component), the dangling bond constituted by the component of the adsorption assist gas is formed on the wafer W.

The adsorption assist gas assists the adsorption of the first source gas described later onto at least a part of the surface of the wafer W. As a result, in a subsequent first source gas supply step S13, the first source is easily adsorbed onto the surface of the wafer W.

In the present embodiment, the first distance A refers to a distance at which an adsorption of the adsorption assist gas is hardly affected by the through-holes 234a when the adsorption assist gas is adsorbed onto the surface of the wafer W. For example, the "distance at which the adsorption of the adsorption assist gas is hardly affected" may refer to a distance from which the adsorption assist gas can diffuse evenly until it reaches the surface of the wafer W. In other words, the "distance at which the adsorption of the adsorption assist gas is hardly affected" may refer to a distance from which the adsorption assist gas can be uniformly supplied into the surface of the wafer W.

<Residual Gas Removing Step S12>

After a predetermined time has elapsed, the valve 243d of the first gas supply pipe 243a is closed to stop a supply of the adsorption assist gas. In the residual gas removing step S12, with the valve 267 and the APC 266 of the exhaust pipe 262 open, the vacuum pump 269 vacuum-exhausts the inner atmosphere of the process space 205 to remove a substance (which is a residual gas) remaining in the process space 205 such as the adsorption assist gas which did not react and reaction by-products out of the process space 205 (residual gas removing step). In addition, in the residual gas removing step S12, the $N_2$ gas serving as the inert gas is continuously supplied into the process space 205. The $N_2$ gas serves as the purge gas, which improves the efficiency of removing the substance remaining in the process space 205 such as the adsorption assist gas which did not react and the reaction by-products out of the process space 205. In addition, in the residual gas removing step S12, the distance from the through-holes 234a to the wafer W is maintained at the first distance A.

<Film-Forming Step>

Then, the film-forming step is performed by performing a cycle including the first source gas supply step S13, a residual gas removing step S14, a second source gas supply step S15 and a residual gas removing step S16 a predetermined number of times (n times).

<First Source Gas Supply Step S13>

Subsequently, by elevating the substrate mounting table 212, the wafer W is moved to the second position at which the distance from the through-holes 234a is the second distance B different from the first distance A as shown in FIG. 1. For example, the second distance B is shorter than the first distance A.

According to the present embodiment, in order to increase a process throughput, the second distance B is set to be shorter than the first distance A. Thereby, it is possible to reduce a space volume of the process space 205. Thereby, it is possible to purge the residual gas quickly in the residual gas removing step S14 and the residual gas removing step S16 described later.

In the first source gas supply step S13, the valve 244d of the second gas supply pipe 244a is opened to supply the first source gas into the second gas supply pipe 244a. A flow rate of the first source gas supplied into the second gas supply pipe 244a is adjusted by the MFC 244c. The first source gas whose flow rate is adjusted is then supplied into the process space 205 through the gas supply pipe 242, the gas introduction hole 231a, the buffer space 232 and the through-holes 234a, and is exhausted through the exhaust pipe 262.

When the first source gas is supplied, simultaneously, the $N_2$ gas serving as the inert gas may be supplied through the gas supply pipe 242. The $N_2$ gas whose flow rate is adjusted is then supplied into the process space 205 through the gas supply pipe 242, the gas introduction hole 231a, the buffer space 232 and the through-holes 234a, and is exhausted through the exhaust pipe 262.

In the first source gas supply step S13, the first source gas is supplied into the process space 205 with the wafer W supported by the substrate mounting table 212. By supplying the first source gas to the wafer W, the first source contained in the first source gas is adsorbed at a location on the surface of the wafer W at which the adsorption assist gas has been adsorbed. On the other hand, the first source is not adsorbed at a location at which the adsorption assist gas has not been adsorbed. In the first source gas supply step S13, for example, the dangling bond formed on the wafer W and the first source contained in the first source gas are bonded together.

<Residual Gas Removing Step S14>

After a predetermined time has elapsed, the valve 244d of the second gas supply pipe 244a is closed to stop a supply of the first source gas. In the residual gas removing step S14, with the valve 267 and the APC 266 of the exhaust pipe 262 open, the vacuum pump 269 vacuum-exhausts the inner atmosphere of the process space 205 to remove a substance (which is the residual gas) remaining in the process space 205 such as the first source gas which did not react or which contributed to an adsorption of the first source and reaction by-products out of the process space 205 (residual gas removing step). In addition, in the residual gas removing step S14, the $N_2$ gas serving as the inert gas is continuously supplied into the process space 205. The $N_2$ gas serves as the purge gas, which improves the efficiency of removing the substance remaining in the process space 205 such as the first source gas which did not react or which contributed to the adsorption of the first source and the reaction by-products out of the process space 205. In addition, in the residual gas removing step S14, the distance from the through-holes 234a to the wafer W is maintained at the second distance B.

<Second Source Gas Supply Step S15>

After the residual gas is removed from the process space 205 in the residual gas removing step S14, the valve 245d of the third gas supply pipe 245a is opened to supply the second source gas into the third gas supply pipe 245a. A flow rate of the second source gas supplied into the third gas supply pipe 245a is adjusted by the MFC 245c. The second source gas whose flow rate is adjusted is then supplied into the process space 205 through the gas supply pipe 242, the gas introduction hole 231a, the buffer space 232 and the through-holes 234a via the third gas supply pipe 245a, and is exhausted through the exhaust pipe 262.

When the second source gas is supplied, simultaneously, the $N_2$ gas serving as the inert gas may be supplied through the gas supply pipe 242. The $N_2$ gas whose flow rate is adjusted is then supplied into the process space 205 through the gas supply pipe 242, the gas introduction hole 231a, the buffer space 232 and the through-holes 234a, and is exhausted through the exhaust pipe 262.

In the second source gas supply step S15, the second source gas is supplied into the process space 205 with the wafer W supported by the substrate mounting table 212. By supplying the second source gas to the wafer W, the first source adsorbed onto the wafer W reacts with the second source contained in the second source gas to form a desired film on the wafer W. In the second source gas supply step S15, for example, by supplying the second source on the first source, a film containing the first source and the second source is formed. In addition, in the second source gas supply step S15, the distance from the through-holes 234a to the wafer W is maintained at the second distance B.

<Residual Gas Removing Step S16>

After a predetermined time has elapsed, the valve 245d of the third gas supply pipe 245a is closed to stop a supply of the second source gas. In the residual gas removing step S16, with the valve 267 and the APC 266 of the exhaust pipe 262 open, the vacuum pump 269 vacuum-exhausts the inner atmosphere of the process space 205 to remove a substance (which is the residual gas) remaining in the process space 205 such as the second source gas which did not react or which contributed to a formation of the film and reaction by-products out of the process space 205 (residual gas removing step). In addition, in the residual gas removing step S16, the distance from the through-holes 234a to the wafer W is maintained at the second distance B.

<Performing Predetermined Number of Times, Step S17>

By performing the cycle including the first source gas supply step S13, the residual gas removing step S14, the second source gas supply step S15 and the residual gas removing step S16 at least once, that is, the predetermined number of times (n times), the film of a desired thickness is formed on the wafer W.

<Substrate Unloading Step S18>

After the film-forming step is completed, by lowering the substrate mounting table 212, the wafer W is placed on the lift pins 207 protruding from the surface of the substrate mounting table 212. Thereafter, the gate valve 149 is opened, and the wafer W is transferred (unloaded) out of the process vessel 202 using the wafer transfer device (not shown). Thereafter, when the substrate processing is terminated, the supply of the inert gas through the inert gas supplier into the process vessel 202 is stopped.

For example, process conditions of the steps described above are as follows:

<Adsorption Assist Gas Supply Step S11>
  Supply Amount: 5 sccm to 1,000 sccm;
  Pressure: 133 Pa to 13,332 Pa; and
  Process Temperature: 50° C. to 600° C.
<First Source Gas Supply Step S13>
  Supply Amount: 100 sccm to 1,000 sccm;
  Pressure: 1,333 Pa to 13,332 Pa; and
  Process Temperature: 50° C. to 600° C.
<Second Source Gas Supply Step S15>
  Supply Amount: 100 sccm to 1,000 sccm;
  Pressure: 1,333 Pa to 13,332 Pa; and
  Process Temperature: 50° C. to 600° C.

The distance between the gas supply port (that is, the through-holes 234a) and the wafer W in the adsorption assist processing step described above and the distance between the gas supply port and the wafer W in the film-forming step described above may vary depending on optimum process conditions such as a type of the film formed on the wafer W, a type of the gas supplied to the wafer W, a process pressure and a supply amount of the gas. Thereby, it possible to improve a uniformity of the film formed on the wafer W.

Subsequently, the reasons why the adsorption assist processing step is performed at the first position and the film-forming step is performed at the second position will be described.

(a) In order to evenly adsorb the adsorption assist gas on the surface of the wafer W, the adsorption assist processing step is performed at the first position at which the adsorption of the adsorption assist gas is hardly affected by a gas flow through the gas supply port.

(b) In order to facilitate gas replacement in the process space 205, the film-forming step is performed at the second position at which the space volume of the process space 205 is reduced.

(c) When it is easy for the adsorption assist gas is to be thermally decomposed, the adsorption assist processing step is performed at the first position at which a thermal influence can be reduced.

Hereinafter, the reasons (a) through (c) will be described in detail. First, the reason (a) will be described. According to the present embodiment, the first position is set to the distance at which the adsorption of the adsorption assist gas onto the surface of the wafer W is hardly affected. For example, the first distance A is set to the distance at which the adsorption assist gas can diffuse evenly until it reaches the surface of the wafer W.

By setting the first distance A as described above, it is possible to uniformly supply the adsorption assist gas onto the surface of the wafer W in the adsorption assist processing step. Since the adsorption assist gas can be uniformly adsorbed onto the wafer W, it is possible to uniformly form the film in the subsequent film-forming step.

Subsequently, as a comparative example, a case in which the distance between the gas supply port (the through-holes 234a) and the wafer W in the adsorption assist processing step is shorter than the first distance A will be described. In the comparative example, the distance between the gas supply port and the wafer W in the adsorption assist processing step is set to a distance at which at least the adsorption assist gas diffuses unevenly.

In the comparative example, it is conceivable that an arrangement of the through-holes 234a may affect the wafer W. In the adsorption assist processing step, the adsorption assist gas is supplied toward the wafer W through the through-holes 234a. However, a partial pressure of the adsorption assist gas passing through the through-holes 234a is very high. Thus, immediately after the adsorption assist gas is ejected through the through-holes 234a, a pressure and density of the adsorption assist gas are high.

In the comparative example, the adsorption assist gas whose density is high is supplied to a portion on the surface of the wafer W immediately below the through-holes 234a, and the adsorption assist gas whose density is low as compared with that of the adsorption assist gas supplied to the portion immediately below the through-holes 234a is supplied to another portion on the surface of the wafer W which is a portion other than the portion immediately below the through-holes 234a. Therefore, the density of the adsorption assist gas adsorbed on the surface of wafer W may be non-uniform on the surface of the wafer W. When the subsequent film-forming step is performed in such a state, the film is formed with the adsorption assist gas non-uniformly adsorbed on the surface of wafer W. Therefore, the film formed on the wafer W also becomes non-uniform likewise.

On the other hand, when the adsorption assist gas is supplied in a state at which the first distance A is set as in the present embodiment, the adsorption assist gas is uniformly supplied to the surface (processing surface) of the wafer W. As a result, it is possible to uniformly adsorb the adsorption assist gas on the surface of the wafer W. Therefore, it is possible to uniformly form the film even in the film-forming step.

The reason (b) will be described. By setting the second position such that the second distance B is shorter than the first distance A, it is possible to reduce the space volume of the process space 205. Thereby, it is possible to quickly purge the inner atmosphere of the process space 205 in the residual gas removing step S14 and the residual gas removing step S16 of the film-forming step.

In particular, when the cycle from the first source gas supply step S13 to the residual gas removal step S16 is performed a plurality of times in the film-forming step, it is possible to shorten a process time of the cycle. Thereby, it is possible to greatly shorten a process time of an entire processing (that is, the substrate processing).

In addition, as a comparative example, the distance between the through-holes 234a and the wafer W in the film-forming step described above may be set to a distance by which the gas diffuses. However, in the adsorption assist processing step before the film-forming step, since the adsorption assist gas is already uniformly adsorbed onto the wafer W, it is possible to uniformly form the film regardless of positions of the through-holes 234a. Therefore, the film-forming step can be performed even when the distance between the through-holes 234a and the wafer W is not sufficient for the gas to diffuse. Therefore, it is preferable to reduce the space volume of the process space 205 in consideration of the process throughput.

The reason (c) will be described. The present embodiment is more effective when the adsorption assist gas is a gas that is prone to thermal decomposition. As shown in FIG. 2, the heater 213 is provided in the substrate mounting table 212, and when a distance between the dispersion plate 234 and the substrate mounting table 212 is short, the dispersion plate 234 is affected by the heater 213. As a result, the temperature of the heater 213 may be elevated to a high temperature.

When a gas prone to thermal decomposition is supplied in such a situation described above, it is conceivable that the gas is exhausted without being adsorbed onto the wafer W. Therefore, as described in (c) above, when the adsorption assist gas is prone to thermal decomposition, it is preferable that the adsorption assist processing step is performed at the first position at which the thermal influence can be reduced.

(3) Effects According to First Embodiment

According to the present embodiment, it is possible to obtain one or more among the following effects.

(a) By improving an adsorptivity of the source gas such as the first source gas on the surface of the wafer W, it is possible to form the film whose uniformity on the surface of the wafer W is improved.

(b) In particular, by improving the adsorptivity of the source gas on the surface of the wafer W at an initial stage of the film-forming step, it is possible to form a continuous film.

(4) Modified Examples

Subsequently, modified examples of the substrate processing sequence preferably used in the first embodiment of the present disclosure will be described.

First Modified Example

Figure 4:
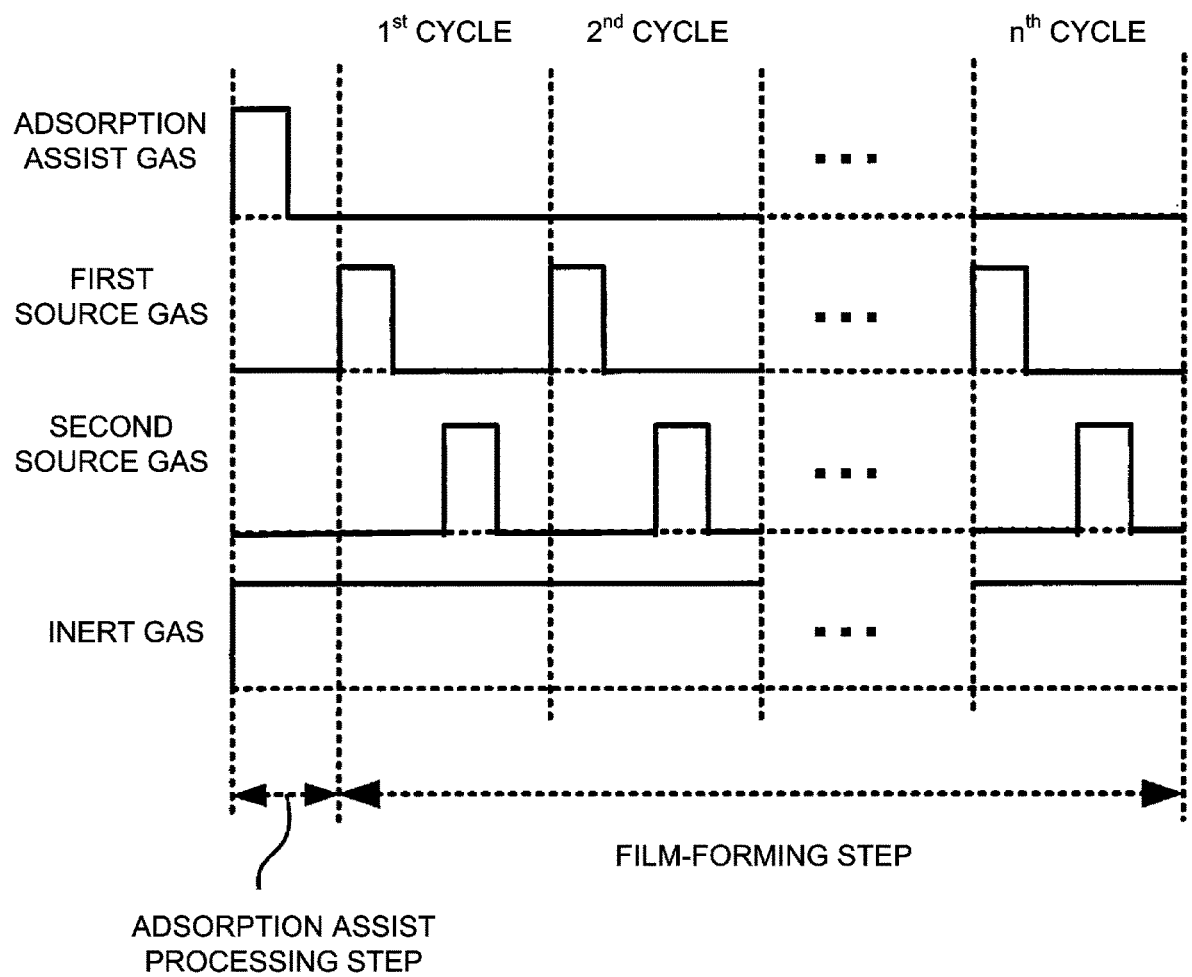
FIG. 4 is a diagram schematically illustrating a substrate processing sequence preferably used in the first embodiment of the present disclosure.
Figure 5:
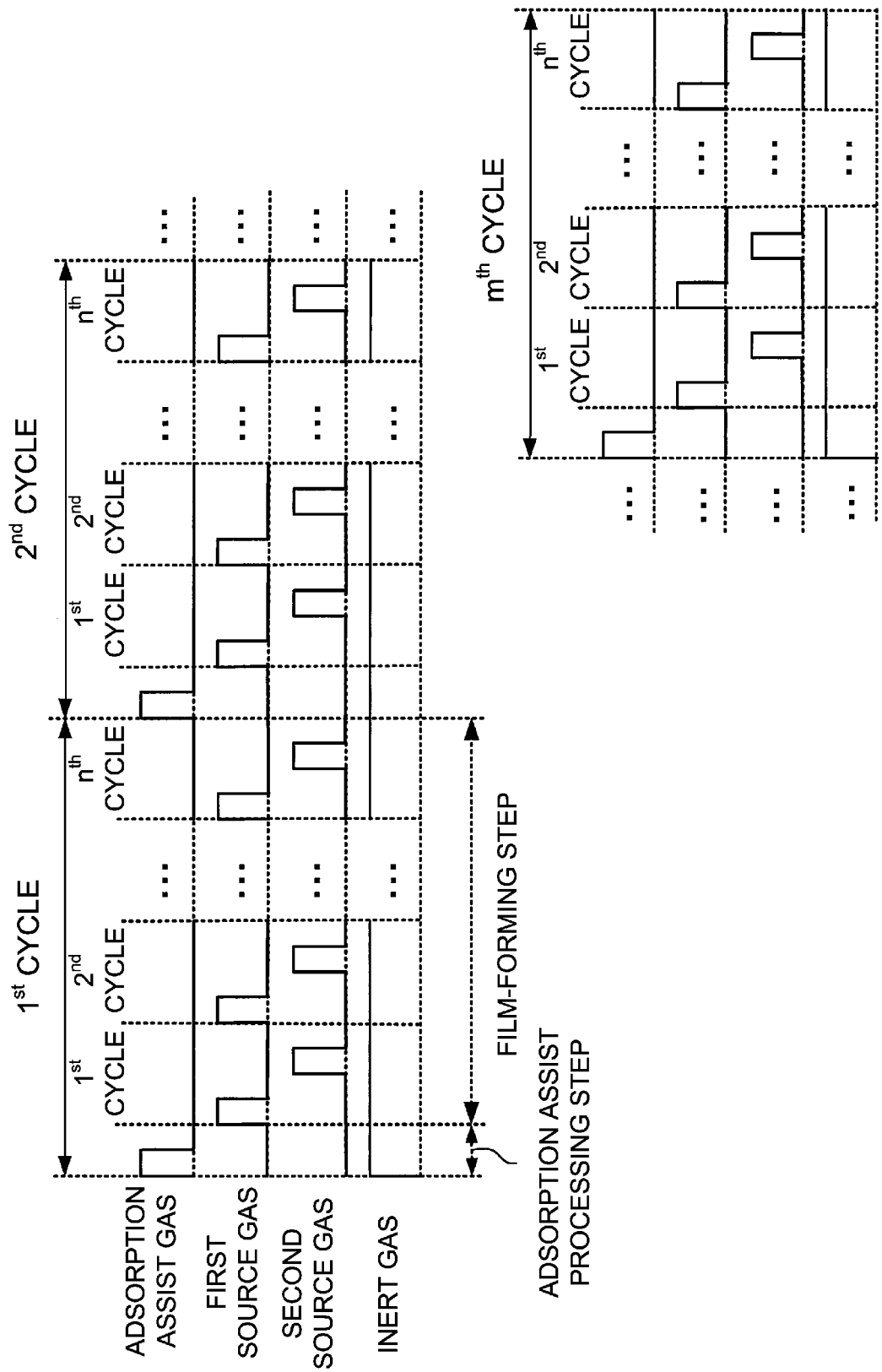
FIG. 5 is a diagram schematically illustrating a modified example of the substrate processing sequence preferably used in the first embodiment of the present disclosure.

FIG. 5 is a diagram schematically illustrating a first modified example of the substrate processing sequence shown in FIG. 4. As shown in FIG. 5, in the present modified example, a cycle including the step S11 through the step S17 described above is performed on the wafer W a predetermined number of times (m times), that is, at least once. That is, the cycle of the present modified example, which includes the adsorption assist processing step (S11 and S12) of causing the adsorption assist gas to be adsorbed onto the wafer W and the step S17 of performing the cycle of the first embodiment in which the film-forming step (S13, S14, S15 and S16) are sequentially performed in this order to form the film of the desired thickness on the wafer W, is performed the predetermined number of times (m times), that is, at least once. Thereby, it is possible to form the film of the desired thickness on the wafer W. According to the present modified example, by performing the adsorption assist processing step (S11 and S12) whenever the film-forming step is performed the predetermined number of times (n times), it is possible to assist the adsorption of the first source gas onto at least a portion on the surface of the wafer W. In addition, by improving an adsorptivity of the first source contained in the first source gas, it is possible to form a continuous film of the desired thickness whose uniformity on the surface of the wafer W is improved. In addition, it is also possible to improve the process throughput.

Second Modified Example

Figure 6:
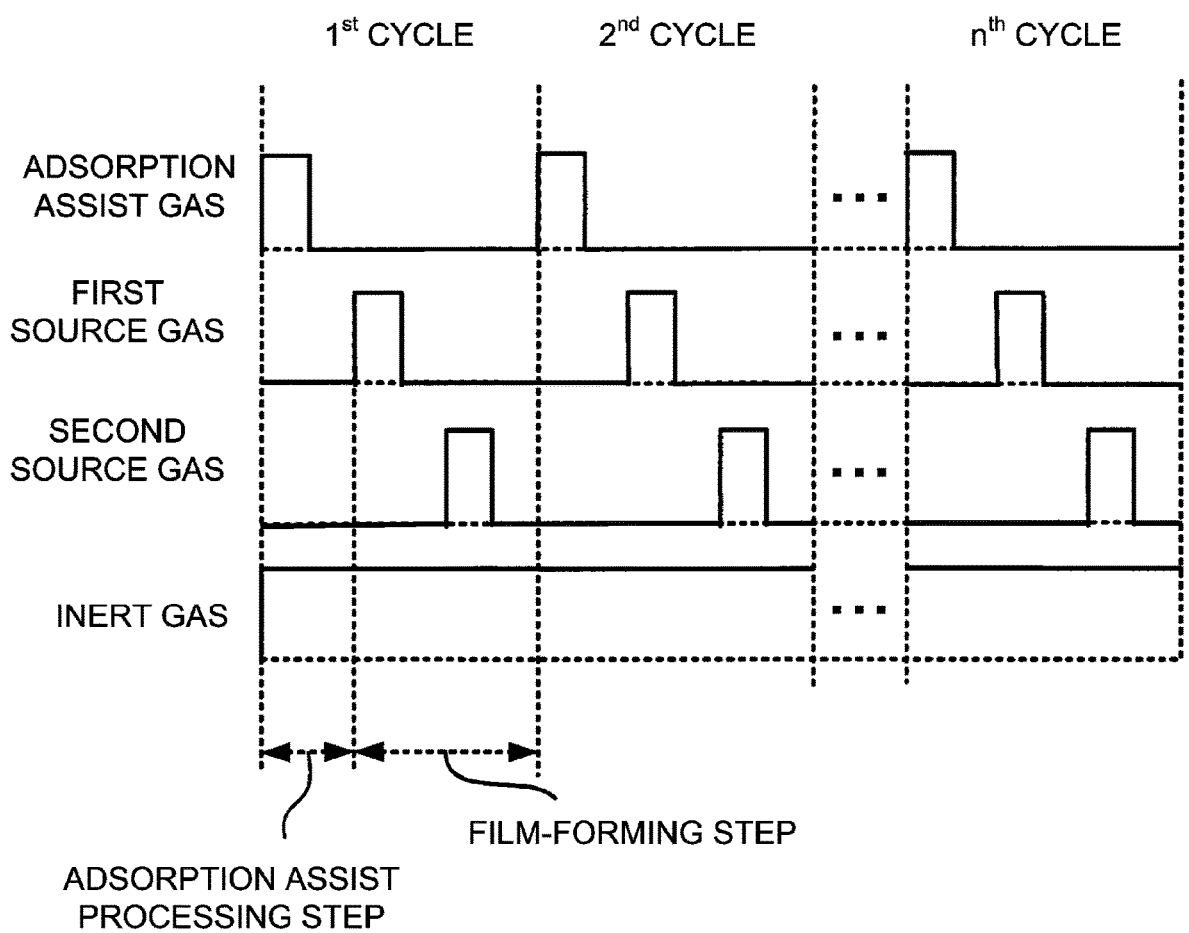
FIG. 6 is a diagram schematically illustrating another modified example of the substrate processing sequence preferably used in the first embodiment of the present disclosure.

FIG. 6 is a diagram schematically illustrating a second modified example of the substrate processing sequence shown in FIG. 4. As shown in FIG. 6, in the present modified example, a cycle including the step S11 through the step S16 described above is performed on the wafer W a predetermined number of times (n times). That is, the cycle of the present modified example, in which the adsorption assist processing step (S11 and S12) of adsorbing the adsorption assist gas on the wafer W and the film-forming step (S13, S14, S15 and S16) of forming the film of the desired thickness on the wafer W are to be sequentially performed, is performed the predetermined number of times (n times), that is, at least once. Thereby, it is possible to form the film of the desired thickness on the wafer W. According to the present modified example, by performing the adsorption assist processing step (S11 and S12) whenever the film-forming step (S13, S14, S15 and S16) is performed, it is possible to assist the adsorption of the first source gas onto at least a portion on the surface of the wafer W. In addition, by improving the adsorptivity of the first source contained in the first source gas, it is also possible to form a continuous film of the desired thickness whose uniformity on the surface of the wafer W is improved.

(5) Other Embodiments

Second Embodiment

Figure 7:
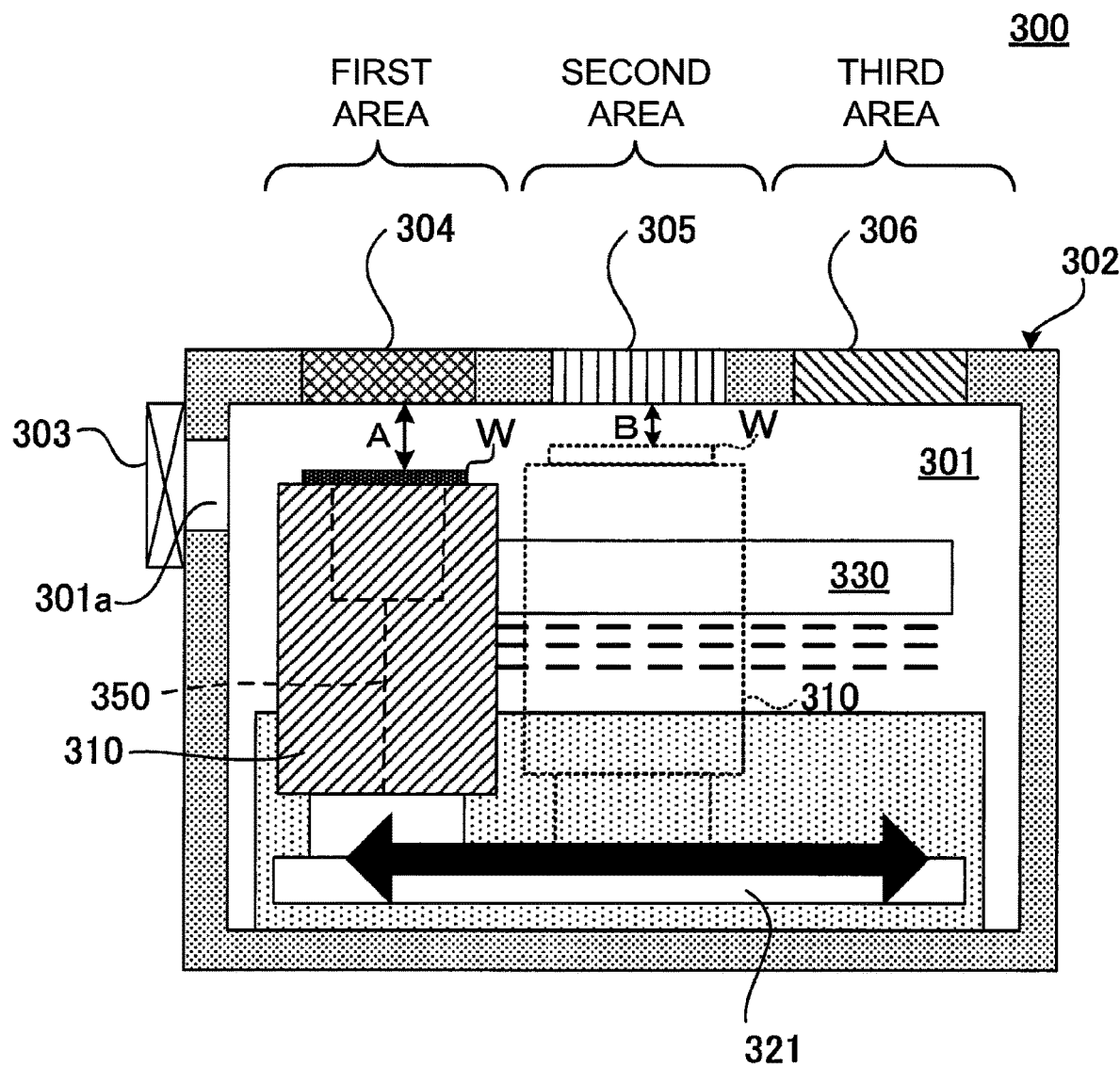
FIG. 7 is a diagram schematically illustrating a vertical cross-section of a substrate processing apparatus preferably used in a second embodiment of the present disclosure.

Hereinafter, a second embodiment according to the technique of the present disclosure will be described with reference to FIG. 7. Portions different from those of the first embodiment will be mainly described in detail below, and the description of portions the same as the first embodiment will be omitted.

A configuration of a substrate processing apparatus of the second embodiment is different from that of the first embodiment. Others are the same as in the first embodiment. Hereinafter, the configuration of the substrate processing apparatus according to the present embodiment will be described below.

A substrate processing apparatus 300 includes a process vessel 302 in which the wafer W is processed. For example, the process vessel 302 includes a sealed vessel, and is made of a metal material such as aluminum (Al) and stainless steel (SUS). In an inner portion (that is, a hollow portion) of the process vessel 302, a process chamber 301 constituting a process space in which the wafer W is processed is provided. A substrate loading/unloading port 301*a* and a gate valve 303 configured to open and close the substrate loading/unloading port 301*a* are provided on a side wall of the process vessel 302, and the wafer W can be transferred into or out of the process vessel 302 via the substrate loading/unloading port 301*a*.

The process vessel 302 is divided into a first area, a second area and a third area. In the first area, an adsorption assist gas supplier (which is an adsorption assist gas supply structure or an adsorption assist gas supply system) 304 through which the adsorption assist gas (which is the process gas and the film-forming auxiliary gas) is supplied is provided. The first area may also be referred to as a first process region or an adsorption assist processing region. In the second area, a first source gas supplier (which is a first source gas supply structure or a first source gas supply system) 305 through which the first source gas is supplied is provided. The second area may also be referred to as a second process region or a first source gas supply region. In the third area, a second source gas supplier (which is a second source gas supply structure or a second source gas supply system) 306 through which the second source gas is supplied is provided. The third area may also be referred to as a third process region or a second source gas supply region. The first area serves as an area in which the adsorption assist processing step is performed. The second area and the third area serve as areas in which the film-forming step of forming the film on the wafer W is performed. The second area and the third area may also be referred to as a "film-forming processing area". In addition, the areas described above communicate with one another.

A substrate mounting table (which is a part of a substrate support) 310 on which the wafer W is placed and supported is provided in the process vessel 302. The substrate mounting table 310 can be elevated or lowered. The wafer W is placed on and supported by an upper surface (also referred to as a "substrate placing surface") of an upper end of the substrate mounting table 310.

A slide structure 321 serving as a driver capable of driving the substrate mounting table 310 to reciprocate left and right in the process vessel 302 is connected to a lower end portion of the substrate mounting table 310. The slide structure 321 is fixed to the bottom of the process vessel 302. The slide structure 321 is configured to move the substrate mounting table 310 and the wafer W on the substrate placing surface in a horizontal direction between one end and the other end of the process vessel 302, that is, among the first area, the second area and the third area. For example, the slide structure 321 may be embodied by a combination of components such as a feed screw (ball screw) and driving sources typified by an electric motor M.

That is, in the process vessel 302, by reciprocating the substrate mounting table 310 by the slide structure 321, it is possible to reciprocate the wafer W supported by the substrate mounting table 310 among the first area, the second area and the third area.

The slide structure 321 performs a reciprocating motion described above by operating each driving source such as the electric motor M. Therefore, regarding relative positional relationships among the wafer W placed on the upper surface of the substrate mounting table 310, the adsorption assist gas supplier 304, the first source gas supplier 305 and the second source gas supplier 306, it is possible to adjust the relative positional relationships by controlling each driving source of the slide structure 321.

The adsorption assist gas supplier 304 is provided on a ceiling of the process chamber 301 in the first area. The adsorption assist gas supplier 304 is configured such that the adsorption assist gas is supplied to the wafer W on the substrate mounting table 310 in the first area through the adsorption assist gas supplier 304. The first gas supplier described above is connected to the adsorption assist gas supplier 304.

The first source gas supplier 305 is provided on the ceiling of the process chamber 301 in the second area. The first source gas supplier 305 is configured such that the first source gas is supplied to the wafer W on the substrate mounting table 310 in the second area through the first source gas supplier 305. The second gas supplier described above is connected to the first source gas supplier 305.

The second source gas supplier 306 is provided on the ceiling of the process chamber 301 in the third area. The second source gas supplier 306 is configured such that the second source gas is supplied to the wafer W on the substrate mounting table 310 in the third area through the second source gas supplier 306. The third gas supplier described above is connected to the second source gas supplier 306.

With the wafer W supported thereon, the substrate mounting table 310 moves such that the wafer W is located at a first position in the process chamber 301 when the adsorption assist processing step is performed in the first area. Then, when the film-forming step is performed in the second area or the third area, the substrate mounting table 310 moves such that the wafer W is located at a second position in the process chamber 301. In the present embodiment, the first position refers to a position at which a distance between the surface of the wafer W and a gas supply port of the adsorption assist gas supplier 304 facing the surface of the wafer W is a first distance "A" shown in FIG. 7. Further, the second position refers to a position at which the distance between the surface of the wafer W and a gas supply port of the first source gas supplier 305 (or a gas supply port of the second source gas supplier 306) facing the surface of the wafer W is a second distance "B" shown in FIG. 7 different from the first distance A. In addition, according to the present embodiment, the second position is a position different from the first position both in the vertical direction and the horizontal direction, and, for example, the second distance B is set to be shorter than the first distance A. Even in such a case, the adsorption assist gas is adsorbed onto the surface of the wafer W by supplying the adsorption assist gas to the wafer W, the first source contained in the first source gas is adsorbed onto the surface of the wafer W by supplying the first source gas, and the first source adsorbed on the surface of the wafer W reacts with the second source contained in the second source gas by supplying the second source gas. Thereby, a film of a desired thickness is formed on the wafer W.

Further, a heater 330 serving as a heating source and configured to heat the wafer W is provided below the substrate placing surface of the substrate mounting table 310. Unlike the substrate mounting table 310, the heater 330 is fixed to the process vessel 302 without reciprocating. The heater 330 is provided so as to extend from the first area through the third area. A state of electric conduction to the heater 330 is feedback-controlled based on temperature information detected by a temperature sensor (not shown) provided in the vicinity of the wafer W. As a result, the heater 330 is configured such that the temperature of the wafer W supported by the substrate mounting table 310 is maintained at a predetermined temperature.

A wafer elevator 350 stands by below the substrate mounting table 310. The wafer elevator 350 is used when the wafer W is transferred (loaded) into or transferred (unloaded) out of the process vessel 302.

An exhaust pipe (not shown) is connected to the process vessel 302 so as to communicate with the process chamber 301. A vacuum pump (not shown) serving as a vacuum exhaust apparatus is connected to the exhaust pipe via a valve (not shown) serving as an opening/closing valve and an APC (Automatic Pressure Controller) valve (not shown) serving as a pressure regulator (pressure adjusting structure). The vacuum pump is configured to vacuum-exhaust an inner atmosphere of the process vessel 302 such that an inner pressure of the process vessel 302 reaches and is maintained at a predetermined pressure (vacuum degree).

Even when the substrate processing apparatus 300 described above is used, a substrate processing sequence and process conditions may be substantially the same as those of the first embodiment described above, and it is possible to obtain substantially the same effects as the first embodiment described above. That is, the distance between the gas supply port and the wafer W in the adsorption assist processing step and the distance between the gas supply port and the wafer W in the film-forming step may vary depending on the optimum process conditions such as the type of the film formed on the wafer W, the type of the gas supplied to the wafer W, the process pressure and the supply amount of the gas. Thereby, it possible to improve the uniformity of the film formed on the wafer W.

For example, the second embodiment is described in detail by way of an example in which the distance between the gas supply port of each gas supplier and the wafer W is set to be the first distance A or the second distance B by elevating or lowering the substrate mounting table 310. However, the second embodiment is not limited thereto. For example, the second embodiment is may also be preferably applied when the distance between the gas supply port of each gas supplier and the wafer W is changed. For example, the distance between the gas supply port of each gas supplier and the wafer W may be changed by setting a height of the wafer W to be constant and differentiating heights of the gas supply port of the adsorption assist gas supplier 304, the gas supply port of the first source gas supplier 305, and the gas supply port of the second source gas supplier 306.

For example, the embodiments are described in detail by way of an example in which the adsorption assist processing step of supplying the adsorption assist gas is performed before the film-forming step. However, the technique of the present disclosures is not limited thereto. For example, the technique of the present disclosures may also be applied when an adsorption inhibition processing step of supplying an adsorption inhibitory gas inhibiting the adsorption of the first source gas to be supplied later is performed before the film-forming step. The adsorption inhibitory gas inhibits the adsorption of the first source gas to be supplied later on at least a part of the surface of the wafer W. By supplying the adsorption inhibitory gas before the film-forming step as described above, it is possible to inhibit the formation of the film on at least a part of the surface of the wafer W. That is, it is possible to selectively form the film (or to inhibit the formation of the film) at a region on a surface of the wafer W. Since the adsorption inhibitory gas selectively assists (or inhibits) the formation of the film by the source gas in the film-forming step described later, the adsorption inhibitory gas may also be referred to as the "film-forming auxiliary gas".

For example, the embodiments are described in detail by way of an example in which the distance between the gas supply port and the wafer W is set to be different by elevating or lowering the substrate mounting table 212 or 310 supporting the wafer W. However, the technique of the present disclosures is not limited thereto. For example, the technique of the present disclosures may also be applied when the distance between the gas supply port and the wafer W is set to be different by moving the gas supply port.

For example, the embodiments are described in detail by way of an example in which the distance between the gas supply port and the wafer W in the adsorption assist processing step is set to be different from the distance between the gas supply port and the wafer W in the film-forming step (that is, in the first source gas supply step and the second source gas supply step). However, the technique of the present disclosures is not limited thereto. For example, the technique of the present disclosures may also be applied when the distance between the gas supply port and the wafer W in the first source gas supply step is set to be different from the distance between the gas supply port and the wafer W in the second source gas supply step. That is, the adsorption assist gas may be supplied at a position at which the adsorption assist gas is easily adsorbed onto the wafer W in the adsorption assist processing step, the first source gas may be supplied at a position at which the first source gas is easily adsorbed onto the wafer W when the first source gas is supplied in the film-forming step, and the second source gas may be supplied at a position at which the second source gas easily reacts with the first source when the second source gas is supplied in the film-forming step.

For example, the embodiments are described in detail by way of an example in which the $H_2O$ is used as the adsorption assist gas. However, the technique of the present disclosures is not limited thereto. For example, the technique of the present disclosures may also be applied when a gas such as alcohol is used as the adsorption assist gas. In addition, as the adsorption inhibitory gas, for example, a gas such as ammonia ($NH_3$) gas and a gas containing amine or alkylaminosilane may be used.

Further, as the first source gas in the embodiments described above, for example, the silicon-containing gas described above may be used. However, a gas such as trisdimethylaminosilane ($Si[N(CH_3)_2]_3H$, abbreviated as 3DMAS) may be used as the first source gas.

For example, the embodiments are described in detail by way of an example in which the ozone is used as the second source gas. However, another oxygen-containing gas may be used when the SiO film is formed. In addition, the embodiments are described in detail by way of an example in which the SiO film is formed. However, the technique of the present disclosures is not limited thereto. For example, a nitrogen-containing gas may be used when a silicon nitride film (also simply referred to as an "SiN film") is formed. As the nitrogen-containing gas, for example, a gas such as the ammonia ($NH_3$) gas may be used.

For example, the embodiments are described in detail by way of an example in which the SiO film is formed by using the first source gas and the second source gas. However, the technique of the present disclosures is not limited thereto. For example, the technique of the present disclosures may also be applied when three or more source gases are used. In such a case, for example, as one of the source gases, a gas such as a carbon (C)-containing gas or a gas containing impurities such as boron (B) may be used.

For example, the first embodiment is described in detail by way of an example in which the first gas supplier through the third gas supplier are connected to the gas supply pipe 242 and each gas is supplied into the process space 205 through the gas supply pipe 242. However, the technique of the present disclosures is not limited thereto. For example, the technique of the present disclosures may also be applied when each of the first gas supplier through the third gas supplier is connected to the lid 231, and each gas is supplied into the process space 205 through each gas supply pipe.

For example, recipes used in the substrate processing are preferably prepared individually according to process contents and stored in the memory 280c via an electric communication line or the external memory 282. When starting the substrate processing, the CPU 280a is preferably configured to select an appropriate recipe among the recipes stored in the memory 280c according to the process contents. Thus, various films of different composition ratios, qualities and thicknesses may be formed in a reproducible manner by using a single substrate processing apparatus. In addition, since the burden on an operator of the substrate processing apparatus may be reduced, various processes may be performed quickly while preventing a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. In addition, the existing recipe already stored in the substrate processing apparatus may be directly changed to the new recipe by operating the input device 281 of the substrate processing apparatus.

A substrate processing sequence and process conditions when the substrate processing apparatus described above is used may be substantially the same as those of the embodiments or the modified examples described above, and it is possible to obtain substantially the same effects as the embodiments or the modified examples described above.

While the technique of the present disclosure is described in detail by way of the embodiments and the modified examples, the technique of the present disclosure is not limited thereto. For example, the embodiments and the modified examples described above may be appropriately combined.

According to some embodiments of the present disclosure, it is possible to improve the uniformity of the film formed on the substrate.

What is claimed is:
1. A substrate processing method, comprising:
   (a) loading a substrate into a process chamber;
   (b) setting the substrate at a first position such that a distance between the substrate placed on a substrate support and a gas supply port of a film-forming auxiliary gas supplier is a first distance, and causing a film-forming auxiliary gas to be adsorbed onto the substrate by supplying the film-forming auxiliary gas from the film-forming auxiliary gas supplier to the substrate; and

(c) moving the substrate support to a second position such that a distance between the substrate and a gas supply port of a source gas supplier is a second distance shorter than the first distance, and forming a film of a predetermined thickness on the substrate by performing: (c-1) supplying a source gas from the source gas supplier to the substrate; (c-2) stopping a supply of the source gas; and (c-3) exhausting a residual gas from the process chamber while the substrate support is maintained at the second position.

2. The substrate processing method of claim 1, wherein the source gas comprises a first source gas and a second source gas,
wherein a cycle is performed at least once in (c), the cycle comprising:
(c-4) causing a first source contained in the first source gas to be adsorbed onto the substrate by supplying the first source gas to the substrate; and
(c-5) causing the first source adsorbed on the substrate to react with a second source contained in the second source gas by supplying the second source gas to the substrate, and
wherein (c-3) is performed between performing (c-4) and (c-5).

3. The substrate processing method of claim 2, wherein a cycle comprising (b) and (c) is performed at least once.

4. The substrate processing method of claim 2, wherein the film-forming auxiliary gas assists an adsorption of the first source gas onto at least a part of a surface of the substrate.

5. The substrate processing method of claim 2, wherein the film-forming auxiliary gas inhibits an adsorption of the first source gas onto at least a part of a surface of the substrate.

6. The substrate processing method of claim 1, wherein the film-forming auxiliary gas comprises an adsorption assist gas.

7. The substrate processing method of claim 1, wherein the film-forming auxiliary gas comprises an adsorption inhibitory gas.

8. The substrate processing method of claim 1, wherein the film-forming auxiliary gas is prone to thermal decomposition.

9. A substrate processing method, comprising:
performing a cycle at least once, the cycle comprising:
(a) loading a substrate into a process chamber;
(b) setting the substrate at a first position such that a distance between the substrate placed on a substrate support and a gas supply port of a film-forming auxiliary gas supplier is a first distance, and causing a film-forming auxiliary gas to be adsorbed onto the substrate by supplying the film-forming auxiliary gas from the film-forming auxiliary gas supplier to the substrate; and
(c) moving the substrate support to a second position such that a distance between the substrate and a gas supply port of a source gas supplier is a second distance shorter than the first distance, and forming a film of a predetermined thickness on the substrate by performing: (c-1) supplying a source gas from the source gas supplier to the substrate; (c-2) stopping a supply of the source gas; and (c-3) exhausting a residual gas from the process chamber while the substrate support is maintained at the second position.

10. The substrate processing method of claim 9, wherein the source gas comprises a first source gas and a second source gas, and
wherein a cycle is performed at least once in (c), the cycle comprising:
(c-4) causing a first source contained in the first source gas to be adsorbed onto the substrate by supplying the first source gas to the substrate; and
(c-5) causing the first source adsorbed on the substrate to react with a second source contained in the second source gas by supplying the second source gas to the substrate.

11. The substrate processing method of claim 10, wherein the film-forming auxiliary gas assists an adsorption of the first source gas onto at least a part of a surface of the substrate.

12. The substrate processing method of claim 10, wherein the film-forming auxiliary gas inhibits an adsorption of the first source gas onto at least a part of a surface of the substrate.

13. A method of manufacturing a semiconductor device comprising the substrate processing method of claim 1.

14. A non-transitory computer-readable recording medium storing a program that when executed by one or more processors of a substrate processing apparatus causes the substrate processing apparatus to perform a method comprising:
(a) loading a substrate into a process chamber;
(b) setting the substrate at a first position such that a distance between the substrate placed on a substrate support and a gas supply port of a film-forming auxiliary gas supplier is a first distance, and causing a film-forming auxiliary gas to be adsorbed onto the substrate by supplying the film-forming auxiliary gas from the film-forming auxiliary gas supplier to the substrate; and
(c) moving the substrate support to a second position such that a distance between the substrate and a gas supply port of a source gas supplier is a second distance shorter than the first distance, and forming a film of a predetermined thickness on the substrate by performing: (c-1) supplying a source gas from the source gas supplier to the substrate; (c-2) stopping a supply of the source gas; and (c-3) exhausting a residual gas from the process chamber while the substrate support is maintained at the second position.

* * * * *